United States Patent
Wilson et al.

(10) Patent No.: US 6,778,621 B1
(45) Date of Patent: Aug. 17, 2004

(54) PRECISION RESAMPLING SYSTEM

(75) Inventors: Dennis L. Wilson, Palo Alto, CA (US); Michael D. Massa, Milpitas, CA (US)

(73) Assignee: Lockheed Martin Corporation, Bethesda, MD (US)

( * ) Notice: Subject to any disclaimer, the term of this patent is extended or adjusted under 35 U.S.C. 154(b) by 735 days.

(21) Appl. No.: 09/691,350

(22) Filed: Oct. 18, 2000

(51) Int. Cl.[7] .............................................. H04L 25/00
(52) U.S. Cl. ...................... 375/371; 375/354; 375/340; 341/61; 332/103
(58) Field of Search ................................ 375/371, 354, 375/340; 332/103; 341/61

(56) References Cited

U.S. PATENT DOCUMENTS

| | | | | |
|---|---|---|---|---|
| 5,225,787 A | * | 7/1993 | Therssen | 327/113 |
| 5,481,568 A | * | 1/1996 | Yada | 375/340 |
| 6,236,283 B1 | * | 5/2001 | Koslov | 332/103 |
| 6,636,165 B2 | * | 10/2003 | Freidhof | 341/61 |

* cited by examiner

*Primary Examiner*—Shuwang Liu
*Assistant Examiner*—Eva Yi Zheng
(74) *Attorney, Agent, or Firm*—Kenneth W. Float

(57) ABSTRACT

A system for changing the sample rate of a digital signal precisely such that frequency coherence is maintained. The system uses coupled direct digital synthesizers to establish the phase of a resampled clock compared to the original clock. The system implements precision resampling that changes the sample rate of a sampled data signal, while maintaining the frequency coherence of the sampled signal. A precision phase calculation for the relation between an input clock and an output clock enables the precision resampling.

5 Claims, 3 Drawing Sheets

PRECISION RESAMPLING SYSTEM

BACKGROUND

The present invention relates generally to communication and signal processing systems, and more particularly, to a system that implements precision resampling that changes the sample rate of a sampled data signal, while maintaining the frequency coherence of the sampled signal.

A problem that occurs in communication and signal processing systems is changing the sample rate of a digital signal. An input signal is sampled at a rate that is established in an input circuit, such as a receiver for a communication signal. Based on other information, it is desired to change the sample frequency of the signal. The result is a process shown in FIG. 1. FIG. 1 illustrates a conventional resampler 10 that implements a resampler function that changes the sample rate of digital signals.

In the past, resampling has been accomplished by converting the signal to analog form with a digital to analog converter, then reconverting the signal to digital form with an analog-to-digital converter. This technique suffers from well-known problems relating to linearity and filtering of digital-to-analog converters and analog-to-digital converters.

Another technique that has been used in the past that maintains the signals as digital signals uses a digital resampling filter. The resampling filter is effectively a processor that upsamples the signal by a large amount, then downsamples the signal to a desired output clock frequency. The filter does not compute all of the upsampled signal values, only those that are to be used at the output. The effect is a filter with a large number of sets of coefficients. Each set of coefficients corresponds to a phase shift of the output clock compared to the input clock for a particular output sample.

A technique that has been used in the past to select the phase of the output sample has been a feedback loop 16 around a resampling filter 11 as is shown in FIG. 2. The resampler 10 shown in FIG. 2 includes the resampling filter 11 whose output is sent to a first-in, first-out (FIFO) buffer 12. A half-full signal is coupled to a phase control circuit 13 that advances the phase of the samples taken by the resampling filter 11. A reference frequency is input to an output clock synthesis circuit 14 that clocks the FIFO 12 to output the resampled data and outputs a resampled clock signal.

In operation, the FIFO buffer 12 is filled half full with samples from the resampling filter 11. When the FIFO buffer 12 is more than half full, the phase of the output samples is advanced by the phase control circuit 13, slowing the output of samples from the resampling filter 11. When the FIFO buffer 12 is less than half full, the phase of the resampling filter 11 is retarded, speeding the output of samples from the resampling filter 11.

The difficulty with this operation is that the feedback loop 16 is a very simple loop that drives the sample rate from the interpolating filter either higher or lower. The result is a limit cycle when operation has stabilized. The limit cycle causes the frequency of a sine wave at the input to be shifted first higher then lower. When precision operation is desired, this instability of the output frequency is not tolerable.

It would therefore be desirable, and it is an objective of the present invention to provide a system that implements precision resampling of a sampled data signal that changes the sample rate of the sampled data signal, while maintaining the frequency coherence of the sampled signal.

SUMMARY OF THE INVENTION

To accomplish the above and other objectives, the present invention provides for a system that implements precision resampling that changes the sample rate of a sampled data signal, while maintaining the frequency coherence of the sampled signal. A precision phase calculation for the relation between an input clock and an output clock enables the precision resampling.

An exemplary precision resampling system comprises a frequency measurement circuit that processes a data clock signal and a reference frequency signal to generate an estimate of the input sample rate of the data clock signal. A phase control circuit processes the estimate of the input sample rate and the reference frequency signal to generate an interpolation control signal. An output clock synthesis circuit processes the reference frequency signal to generate a resampled clock signal. An interpolation filter processes data samples, the data clock signal and the interpolation control signal to generate resampled data in response thereto and wherein the phase of the output samples is controlled by the interpolation control signal. A first-in, first-out buffer outputs the resampled data and the resampled clock signal.

BRIEF DESCRIPTION OF THE DRAWINGS

The various features and advantages of the present invention may be more readily understood with reference to the following detailed description taken in conjunction with the accompanying drawing, wherein like reference numerals designate like structural elements, and in which.

DETAILED DESCRIPTION

Figure 1:
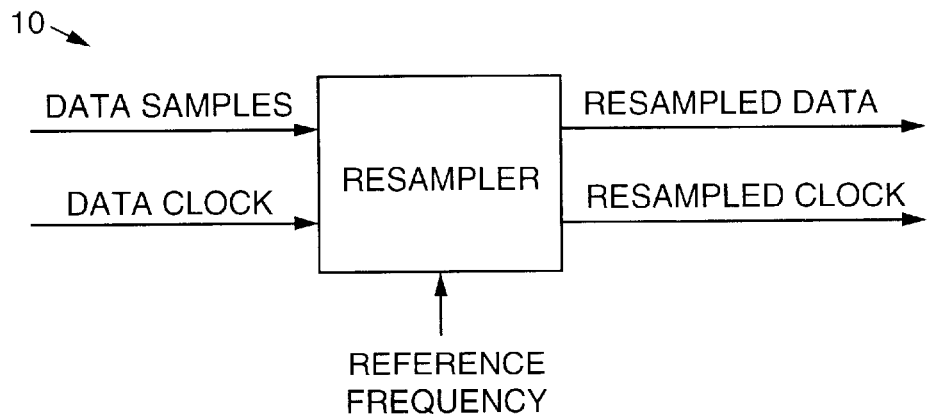
FIG. 1 illustrates conventional resampling wherein a resampler function changes the sample rate of digital signals.
Figure 2:
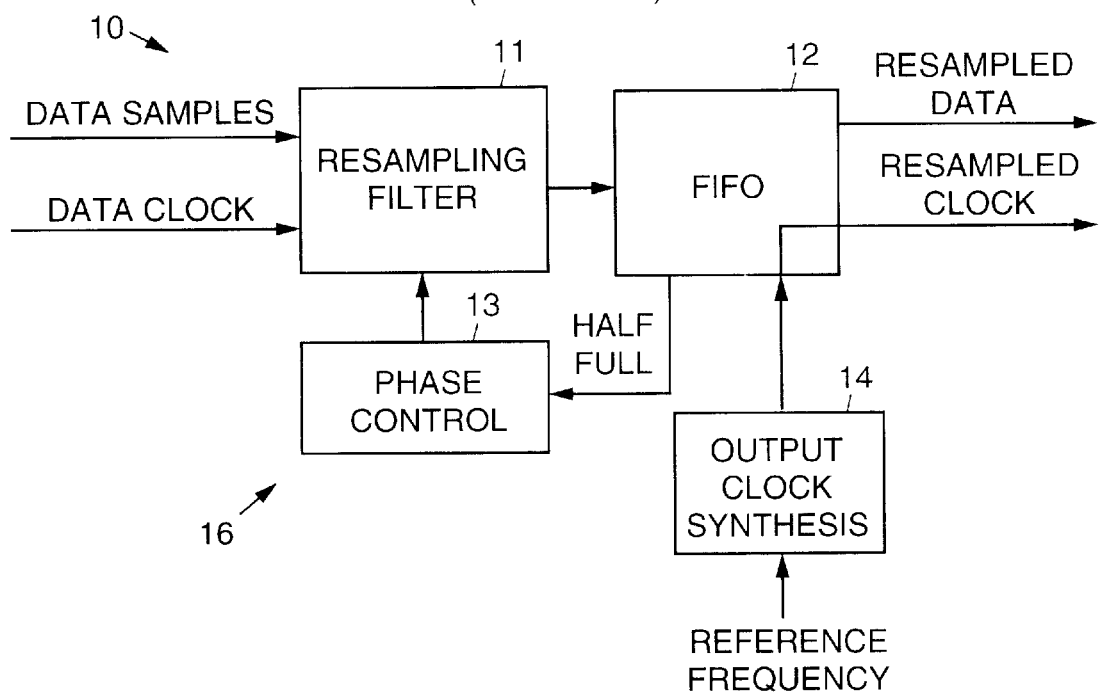
FIG. 2 illustrates conventional resampling phase control using feedback from an output FIFO.
Figure 3:
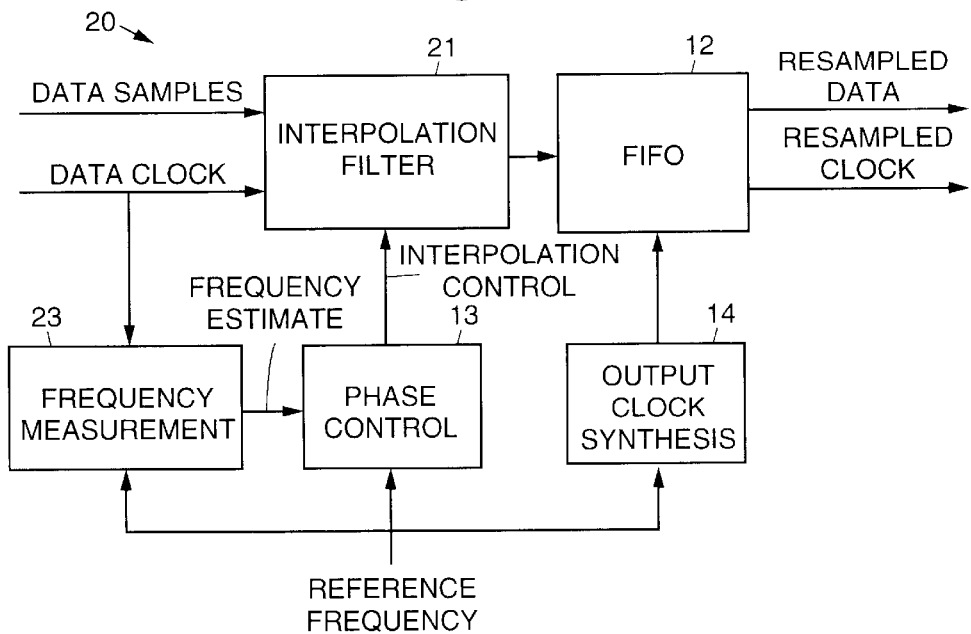
FIG. 3 illustrates an exemplary precision resampler in accordance with the principles of the present invention.

Referring to FIG. 3, it illustrates an exemplary precision resampling system 10 or resampler 20 in accordance with the principles of the present invention. The precision resampler 20 uses a reference frequency to measure the input frequency, and to generate phase control signals and the output frequency.

The precision resampler 20 comprises an interpolation filter 21 that receives data samples and a data clock signal. The interpolation filter 21 is coupled to a first-in, first-out (FIFO) buffer 12. The interpolation filter 21 precisely resamples the data samples and outputs them to the first-in, first-out buffer 12. The first-in, first-out buffer 12 outputs resampled data along with a resampled clock signal.

A reference frequency is input to a phase control circuit 13 and an output clock synthesis circuit 14. The output clock synthesis circuit 14 controls the output of the first-in, first-out buffer 12. The reference frequency is input to a frequency measurement circuit 23 which also receives the data clock signal. The frequency measurement circuit 23 outputs an estimate of the input sample rate to the phase control circuit 13 which controls the phase of the output samples provided the interpolation filter 21.

In operation, the precision resampler 20 starts by estimating the input sample rate accurately using the reference frequency as the standard-against which to measure the frequency. The phase of the resampling is controlled by a set of interlocking direct digital synthesizers 30 (shown in FIG. 4). The arrangement of these synthesizers 30 provides the means for precision resampling.

Figure 4:
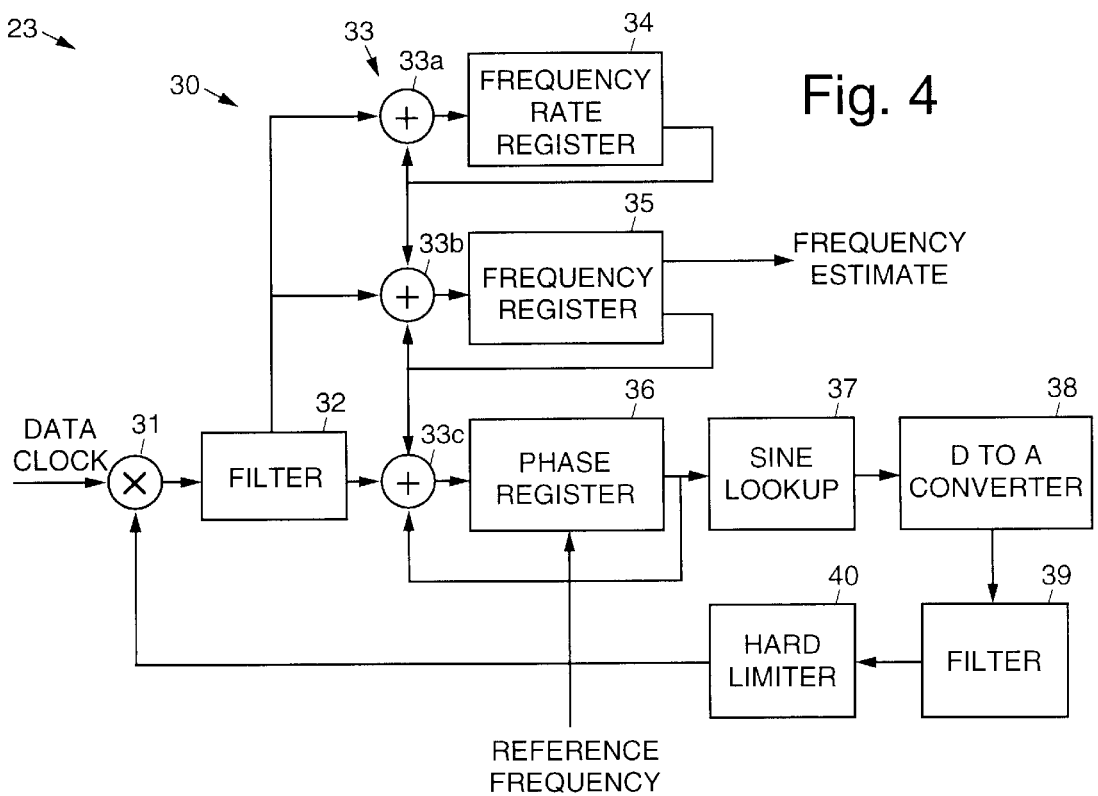
FIG. 4 illustrates a direct digital synthesizer based phase locked loop for estimating frequency and phase.

The frequency measurement circuit 23 estimates the input sample rate using direct digital synthesizers 30 in a phase locked loop arrangement as shown in FIG. 4. The frequency measurement circuit 23 comprises a multiplier 31 that combines the data clock and reference frequency signals which is input to a filter 32. The output of the filter 32 is input to three summing devices 33, identified as a frequency rate summing device 33a, a frequency summing device 33b, and a phase summing device 33c. The summing devices 33a, 33b, 33c are respectively coupled to a frequency rate register 34, a frequency register 35, and a phase register 36.

An output of the frequency rate register 34 is input to the frequency rate and frequency summing device 33a, 33b. An output of the frequency register 35 is input to the frequency and phase summing device 33b, 33c. An output of the phase register 36 is input to the phase summing device 33c. The output of the phase register 36 is input to a SINE lookup table 37 whose output is input by way of a digital to analog (D to A) converter 38 whose output is filtered by a loop filter 39 and coupled through a hard limiter 40 and input to the multiplier 31.

In operation, the loop uses a digital binary number to represent the phase, frequency, and frequency rate during processing. For example the phase might be represented by 48 bits. The top 12 bits might be used in the SINE look-up table 37, providing 4096 different phase values at the input to the filter 32. The resolution of the measurement is the frequency of the reference clock divided by $2^{48}$.

Also available from the frequency estimation loop is the phase of the input signal. The phase is also used in the construction of the interpolation filter phase estimation.

The digital registers for phase, frequency, and frequency rate (frequency rate register 34, frequency register 35 and phase register 36) are clocked at the reference frequency rate. The measurements of phase frequency, and frequency rate are with respect to the reference frequency signal. The stability of the reference frequency signal establishes the phase and frequency stability of the output clock rate.

The processing that converts the input sample rate to the output sample rate uses the reference frequency and a direct digital synthesizer 30 (FIG. 4) for the output sample rate. Two conditions may apply. The first is that the output sample rate is locked to the input sample rate and is some fixed ratio of the input sample rate. The second is that the output sample rate is independent of the input sample rate and is established using the reference frequency.

For example, the output sample rate may be 0.8142 times the input sample rate for a condition where the output sample rate is locked to the input sample rate. This means that when the input sample rate increases, the output sample rate also increases, maintaining the ratio of 0.8142 between the sample rates.

As a second example, the output sample rate may be 50 MHz when the input sample rate is 60 MHz+/−300 Hz. The output sample rate is fixed, while the input sample rate can vary over a small range. This arrangement may be used when a subsequent processor only accepts a constant sample rate.

Figure 5:
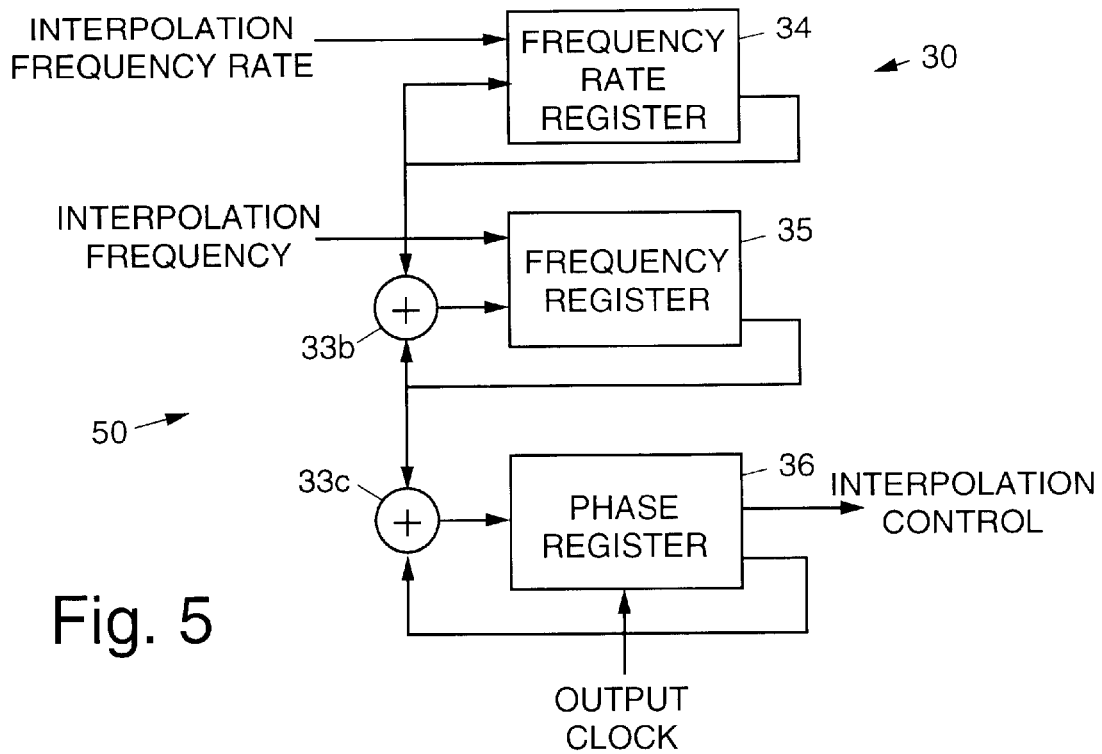
FIG. 5 illustrates interpolation control implemented by a direct digital synthesizer.

Phase control and the phase control circuit 13 will now be discussed. The control of the phase of resampling is an important aspect of the resampling approach employed in the present invention. The phase of the resampled signal is with reference to the input sample clock. For example, an output sample rate that is ¼ slower than the input sample rate might have one sample that matched the phase of the input, the next sample would be one third of the way between the next two sample times, and the next would be two thirds of the way between the next two sample times. The fourth output sample would correspond to a time that is once again in line with the input sample. The phase of the output samples may be determined using a direct digital synthesizer 30 similar to the one used to generate the frequency of the output signal. FIG. 5 shows the structure of an exemplary interpolation control generator 50 employing direct digital synthesizers 30.

The exemplary interpolation control generator 50 (phase control circuit 13) includes a frequency rate register 34, a frequency register 35, and a phase register 36. The frequency rate register 34 receives an interpolation frequency rate signal and a signal fed back from the output thereof. The frequency register 35 receives an interpolation frequency signal. A frequency register summing device 33b receives the signal fed back from the output of the frequency rate register 34 along with a signal fed back from the output of the frequency register 35 and outputs a signal that is input to the frequency register 35. A phase register summing device 33b receives the signal fed back from the output of the frequency register 35 along with a signal fed back from the output of the phase register 36 and outputs a signal that is input to the phase register 36. The output clock is input to the phase register 36. The phase register 36 outputs an interpolation control signal that is applied to the interpolation filter 21 (see FIG. 3).

The interpolation control generator 50 is driven by the output clock. At each output clock tick, the phase of the phase register 36 is stepped by one phase step from the frequency register 35. A preferred implementation reduces the sample rate at the output of the interpolation filter 21. For example, the output sample rate of the interpolation filter 21 might be 60% of the input rate. One phase step for the interpolation filter output clock will be more than one cycle of the input clock. For some of the input clocks, the output phase will be in the next cycle of the input clock. For others, the phase step will cause the phase to step over an input clock cycle into the next cycle of the input clock. When this happens, the phase step causes the phase to be more than one cycle different from the last increment of the phase. This overflow of the phase register 36 is used to indicate to the interpolation filter 21 that an output sample is not to be calculated for a particular input sample.

In effect, the direct digital synthesizer 30 for the interpolation control generator 50 calculates the phase of the input clock at each tick of the output clock. This phase establishes the set of interpolation coefficients that are used to generate the output corresponding to that particular sample of the output.

The phase register 36 may use a large number of bits, generating a very precise measure of the relative phase between the input and the output. The number of sets of interpolation coefficients is generally limited. For example, there may be 4096 sets of coefficients, corresponding to 12 bits of phase. The top twelve bits of the phase register may be used to select the coefficients while the full bits of the phase register 36 are used to maintain the accuracy of the calculation over time.

Figure 6:
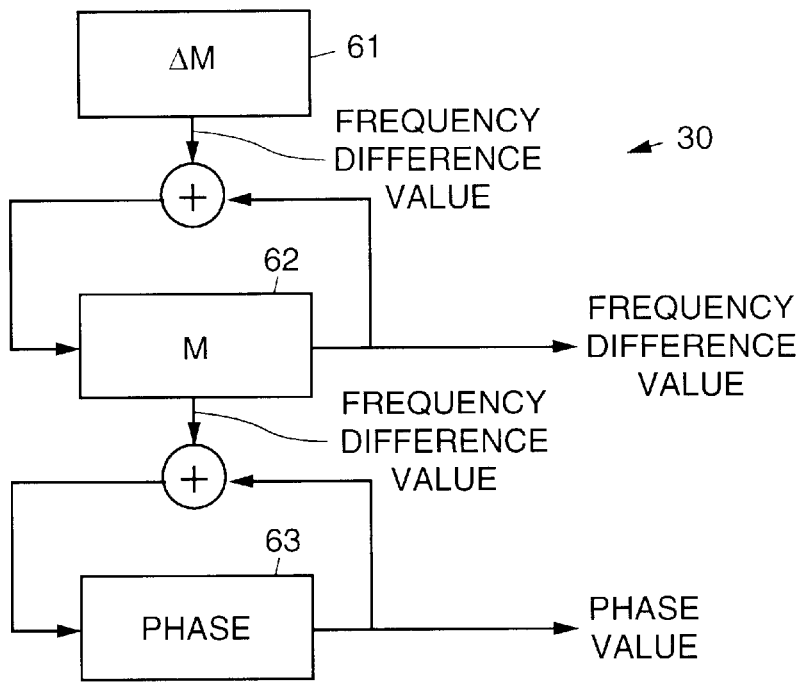
FIG. 6 illustrates a direct digital synthesizer structure operating with the reference clock as the clocking frequency.

Clock generation will now be discussed. The clocks for the precision resampler 20 are generated using direct digital synthesis. The direct digital synthesizer 30 introduces a third clock into the precision resampler 20, namely the reference clock. With reference to FIG. 6, it shows an exemplary direct digital synthesizer 30 that comprises a frequency rate difference (ΔM) register 61, a frequency difference (M) register 62, and a phase register 63. The output of the frequency rate difference (ΔM) register 61 is summed with the output of the frequency difference (M) register 62 in a first summing device 64 and input to the frequency difference (M) register 62. The frequency difference (M) register outputs a digital frequency difference value. The output of the frequency difference (M) register 62 is summed with the output of the phase register 63 in a second summing device 65 and input to the phase register 63. The phase register 63 outputs a digital phase value.

Using the direct digital synthesizer 30 shown in FIG. 6, a fixed clock is generated from the reference clock.

$$f_{out} = M * \text{refclock}/2^N$$

when the frequency is not constant $$f_{out} = (M + M'\Delta t) * \text{refclock}/2^N$$

$$f_{out} = M'^* \text{refclock}/2^N,$$

where $f_{out}$ is the output frequency of the direct digital synthesizer 30, M is the phase update value, refclock is the frequency of the reference clock, and N is the number of bits in the phase register.

$$\phi_{out}(t_{k+1}) = \phi(t_k) + \phi_{out}(t_k)(1/\text{refclock}) + f_{out}(t_k)(1/\text{refclock})^2.$$

Substituting for $f_{out}$, $$\phi_{out}(t_{k+1}) = \phi(t_k) + M/2^N + M'(\frac{1}{2}^N \text{refclock})$$

$$M_{k+1} = M_k + M'$$

$$f_{out}(t_{k+1}) = ((M_{nom} + M_\Delta) + M'(\frac{1}{2}^N \text{refclock})$$

$$f_{out}(t_{k+1}) = M'\text{refclock}^2/2^N.$$

Phase is measured in cycles, not radians. As a consequence $f = d\phi/dt$. There is no factor of $2\pi$ involved in the computation.

$$\phi(t_{k+1}) = \phi(t_k) + M(t_k)/2^N.$$

$$f(t_k) = )M(t_k)\text{refclock})/2^N.$$

Similarly, the value for M in the direct digital synthesizer 30 is the top N bits of the bits of the frequency word from the input. For example, N may be 48 bits.

The interpolation phase calculation will now be discussed. The input clock and the output clock are derived from the reference clock. The process of interpolation uses the two clocks. The interpolation filter 21 needs as an input the value of the phase of the input clock at the time of the interpolation to form an output sample.

If there is a direct digital synthesizer 30 running with a reference clock at $f_2$, the phase of clock 1 in terms of clock 2 is $$\phi^1_{2ref}(t_{k+1}) = \phi^1_{2ref}(t_k) + \frac{M^1_2 \cdot f_{clock2}}{2^N}$$

This phase is exactly the phase required for the interpolation filter 21.

$$M = \frac{2^N \cdot f}{\text{refclock}}$$

Substituting the output clock for the reference clock $$M^1_{2ref} = \frac{2^N \cdot f_1}{f_2}$$

$$M^1_{2ref} = \frac{2^N \cdot M_1}{M_2}$$

Sample rate conversion will now be discussed. When the ratio $M_1/M_2$ is a constant, $M_{2\ ref}^1$ is therefore a constant that can be calculated beforehand at the time the sample rate conversion is established.

Delta frequency removal will now be discussed. When $M_2$ is a constant, the denominator of the fraction is fixed. The numerator changes $$M_1 = M_{nom} + M_{1delta} + \Delta M_1$$

As before the ratio $M_{1nom}/M_2$ is a constant. The value $2^N/M_2$ is another constant. The direct digital synthesizer 30 that generates the phase of clock 1 with reference to clock 2 is therefore a direct digital synthesizer 30 with a value $$M = 2^N \frac{M_{1nom}}{M_2} + M_{1delta}\left(\frac{2^N}{M_2}\right)$$

with a frequency rate value of $$\Delta M = \Delta M_1 \left(\frac{2^N}{M_2}\right)$$

Locked relative phase generation will now be discussed. The generation of the relative phase of the interpolation from the parameters of the input and output clock synthesizers 30 means that the input clock, the output clock, and the phase difference that drives the interpolator are locked to the reference clock. The result will be that the phase difference that drives the interpolation filter 21 will accurately predict the output samples, resulting in one output sample, carefully timed, for each output clock tick. The FIFO buffer 12 associated with the interpolation filter 21 will still be appropriate to smooth out the samples from the interpolation filter 21 that are calculated synchronous with the input clock. However, once the FIFO buffer 12 is half full, the state of the FIFO buffer 12 will not change, eliminating the requirement for a feedback loop from the state of the FIFO buffer 12 to control the output sample rate or the controlling phase shift.

Networked resampling will now be discussed. The use of the direct digital synthesizers 30 also enables the data to be shipped over networks in packets. The timing can be reconstructed at the output, provided the same reference clock is available at the output that is used for the input clock frequency measurement.

The frequency of the input clock can be measured at the input to a network. The frequency measurement will include the frequency and the rate of change of frequency. The measurement can be done once per packet of data. A typical packet of data might be 1000 samples. If the frequency is changing slowly, the change within the packet is small. An error of less than the phase accuracy of the interpolation filter 21 generates exactly the same output as a very accurate measurement. A frequency measurement that is accurate at the center of the packet generates a very accurate output from the interpolation filter 21 in many situations.

The parameters of the input clock direct digital synthesizer 30 and the output clock direct digital synthesizer 30 are easily generated from the parameters generated by measuring the input sample clock phase and frequency. The calculation of the phase of the input clock at each sample of the output clock is a variation of a direct digital synthesizer. This phase is used to control the interpolation filter 21. The frequency parameter for the direct digital synthesizer 30 is a constant depending on the sample rate conversion plus a value derived from the delta frequency on the input clock. The update of the frequency is a constant times the rate of change of the delta frequency of the input clock.

The use of a set of direct digital synthesizers 30 to measure the input frequency, generate the output frequency, and establish the phase of the interpolation filter 21 ensures that a signal propagated through the precision resampler 20 will have very good frequency stability. Further two signals propagated through two separate precision resamplers 20 will have very good coherence. When used with a distribution network that utilizes packets, the precision resampler 20 maintains frequency coherence over the network.

Thus, a system and method that determines the precise relative phase between a digital input signal and a resampled signal has been disclosed. It is to be understood that the above-described embodiment is merely illustrative of some of the many specific embodiments that represent applications of the principles of the present invention. Clearly, numerous and other arrangements can be readily devised by those skilled in the art without departing from the scope of the invention.

What is claimed is:

1. A precision resampling system, comprising:
    a frequency measurement circuit that processes a data clock signal, and a reference frequency signal to generate an estimate of the input sample rate of the data clock signal in response thereto;
    a phase control circuit that processes the estimate of an input sample rate and the reference frequency signal to generate an interpolation control signal;
    an output clock synthesis circuit that processes the reference frequency signal to generate a resampled clock signal;
    an interpolation filter that processes data samples, the data clock signal and the interpolation control signal to generate resampled data in response thereto and wherein the phase of output samples is controlled by the interpolation control signal; and
    a first-in, first-out buffer that outputs the resampled data and a resampled clock signal.

2. The system recited in claim 1 wherein the frequency measurement circuit comprises:
    a multiplier that combines the data clock and reference frequency signals;
    a filter for filtering an output of the multiplier;
    a frequency rate register for receiving an output of the filter to generate an output;
    a frequency register for receiving an output of the filter to generate an output;
    a phase register for receiving the reference frequency and an output of the filter to generate an output;
    a frequency rate summing device for combining the output of the filter and the output of the frequency rate register;
    a frequency summing device for combining the output of the filter and the outputs of the frequency rate register and the frequency register;
    a phase summing device for combining the output of the filter and the outputs of the frequency and phase registers;
    a feedback loop coupled between the output of the phase register and the multiplier.

3. The system recited in claim 2 wherein the feedback loop comprises a SINE lookup table, a digital to analog converter, a loop filter, and a limiter.

4. The system recited in claim 1 wherein the phase control circuit comprises:
    a frequency rate register that processes an interpolation frequency rate signal and a signal fed back from the output thereof;
    a frequency register that processes an interpolation frequency signal and a signal that is the sum of the signal fed back from the output of the frequency rate register and a signal fed back from the output of the frequency register; and
    a phase register that processes an output clock signal, and a signal that is the sum of the signal fed back from the output of the frequency register and a signal fed back from the output of the phase register to produce an interpolation control signal that is applied to the interpolation filter.

5. The system recited in claim 1 wherein the resampled clock signals are generated using a direct digital synthesizer that comprises:
    a frequency rate difference register that outputs a frequency rate difference value;
    a frequency difference register that outputs a frequency difference value produced by summing the frequency rate difference value and the frequency difference value; and
    a phase register that outputs a phase value produced by summing the frequency difference value and the phase value.

* * * * *